United States Patent [19]

Kurokawa et al.

[11] Patent Number: 5,448,387
[45] Date of Patent: Sep. 5, 1995

[54] LIQUID CRYSTAL DISPLAY DEVICE HAVING TAPE CARRIER WITH SEMICONDUCTOR DEVICE ON FLAP PORTION

[75] Inventors: Kazunari Kurokawa; Hironobu Abe; Kazuyuki Kitagawa, all of Mobara, Japan

[73] Assignees: Hitachi, Ltd., Tokyo; Hitachi Device Engineering Co., Ltd., Chiba, both of Japan

[21] Appl. No.: 114,627

[22] Filed: Sep. 2, 1993

[30] Foreign Application Priority Data

Sep. 11, 1992 [JP] Japan ................... 4-243150

[51] Int. Cl.⁶ ................... G02F 1/1343; H05K 1/00
[52] U.S. Cl. ................... 359/88; 257/730; 257/668; 174/255; 174/254; 361/750; 361/772; 361/749
[58] Field of Search ................... 359/88, 85; 257/666, 257/692, 730, 668; 361/750, 772, 813, 749; 174/254, 255

[56] References Cited

U.S. PATENT DOCUMENTS

| | | | |
|---|---|---|---|
| 3,670,639 | 6/1972 | Harnden, Sr. | 361/749 |
| 3,930,115 | 12/1975 | Uden | 257/730 |
| 5,168,384 | 12/1992 | Genba | 359/88 |
| 5,266,746 | 11/1993 | Nishihara et al. | 361/749 |
| 5,281,848 | 1/1994 | Chikawa et al. | 257/666 |

Primary Examiner—William L. Sikes
Assistant Examiner—Kenneth Parker
Attorney, Agent, or Firm—Antonelli, Terry, Stout & Kraus

[57] ABSTRACT

A liquid crystal display device using a tape carrier packaged semiconductor device, which is designed to prevent a crack from developing in part of its resin mold. The semiconductor device is provided with a film-like substrate, a group of electrodes including a plurality of parallel electrodes, each of which is formed with its leading end conforming to one side of the film-like substrate and being elongated in the direction perpendicular to the one side thereof, a semiconductor chip mounted on the film-like substrate in such a manner that it abuts on the group of electrodes, located close to the one side thereof and connected via a wiring layer to the respective electrodes, and a resin mold for use in covering the semiconductor chip. Notches extending in the direction of the parallel electrodes are cut in the film-like substrate beneath the group of electrodes and wherein the leading and trailing ends of each electrode serves to link the electrode and the film-like substrate. A film-like substrate piece formed by the notch and used to support the leading end of each electrode is separated from the film-like substrate in the neighborhood of the resin mold.

9 Claims, 10 Drawing Sheets

LIQUID CRYSTAL DISPLAY DEVICE HAVING TAPE CARRIER WITH SEMICONDUCTOR DEVICE ON FLAP PORTION

BACKGROUND OF THE INVENTION

The present invention relates to a tape carrier packaged semiconductor device for driving a liquid crystal display device.

So-called tape carrier packaged semiconductor devices fall under the category of semiconductor devices which can be manufactured simply.

A process for manufacturing such a semiconductor device comprises the steps of mounting a semiconductor chip on a flexible film-like substrate and leading electrodes of the semiconductor chip via a wiring layer formed on the surface of the film-like substrate to respective electrodes formed on the periphery of the substrate. Moreover, the semiconductor chip is normally covered with a resin mold to protect it from any external force.

On the film-like substrate in the form of a tape, these semiconductor devices are successively formed in the longitudinal direction thereof and the tape is cut on a device basis after the former step is completed.

The semiconductor device thus manufactured is normally mounted on, for example, a printed circuit board incorporating other electronic parts by soldering its electrodes thereto.

Therefore, notches are made in the film-like substrate beneath the Group of electrodes to make only the leading and trailing ends of each electrode serve to link the electrode and the film-like substrate in the form of a bridge to ensure that the solder joints are reliable. This is because a short tends to occur if no notches are made when the electrodes are connected by soldering.

SUMMARY OF THE INVENTION

The present inventors tried to reduce the breadth of the periphery (frame) of the display portion of a liquid crystal display device by mounting a chip on a film-like substrate in such a manner as to set the chip one-sided. In this case, the connecting electrodes protrude from both sides of the chip having notches on both sides thereof.

However, the semiconductor device thus structured is found liable to develop a crack in part of a resin mold.

In other words, the film-like substrate piece used to secure the leading end of each electrode formed by providing the notch in the film-like substrate beneath the Group of electrodes is connected to the film-like substrate in the vicinity of the resin mold, whereby the external force applied to the film-like substrate piece via the connection is seen to concentrate on the neighboring portion of the resin mold without being decentralized (i.e., the external force would be decentralized if no notches were provided).

An object of the present invention, made in view of the foregoing problems, is to provide a semiconductor device designed to prevent a crack from being developed in part of a resin mold.

In order to accomplish the object, a semiconductor device for use in a liquid crystal display device according to the present invention comprises a film-like substrate, a group of electrodes formed with a plurality of parallel electrodes, each of which is formed by making the leading end of its one side conform to one side of the film-like substrate and elongating the electrode in the direction perpendicular to the one side thereof, a semiconductor chip mounted on the film-like substrate in such a manner that it abuts on the group of electrodes, located close to the one side thereof and connected via a wiring layer to the respective electrodes, and a resin mold for use in covering the semiconductor chip, the film-like substrate beneath the group of electrodes being provided with notches extending in the direction of the respective parallel electrodes, the leading and trailing end of each electrode serving to link the electrode and the film-like substrate in the form of a bridge. In such an arrangement, the invention is characterized in that each film-like substrate piece for supporting the leading end of each electrode formed with the notch is separated or spaced from the film-like substrate in the vicinity of the resin mold.

In the semiconductor device thus structured, the film-like substrate pieces for supporting the respective electrodes constituting the groups of electrodes are not connected to the film-like substrate in the vicinity of the resin mold but are spaced or separated therefrom.

Even though an external force is gathered in the film-like substrate piece, the force is prevented from being transmitted to the resin mold as a result of the cut portion.

Therefore, the external force gathered in the film-like substrate piece is prevented from concentrating on the adjoining portion of the resin mold. The resin mold is thus made free from cracking.

These and other objects and many of the attendant advantages of this invention will be readily appreciated as the same becomes better understood by reference to the following detailed description when considered in connection with the accompanying drawing.

DETAILED DESCRIPTION OF THE INVENTION

Referring to the accompanying drawings, a detailed description will be given of the preferred embodiments of the present invention.

Figure 4:
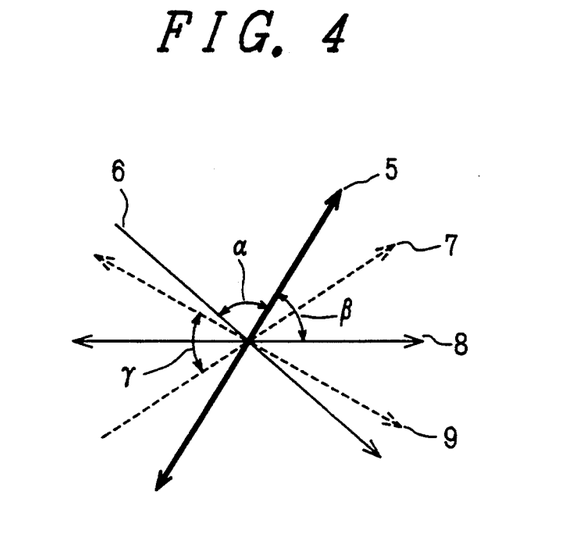
FIG. 4 is a diagram explanatory of directions in which liquid crystal molecules are arranged and twisted, a direction of the axis of a deflecting plate, and the related optical axis of a refracted member in the liquid crystal display device according to the first embodiment of the present invention.
Figure 5:
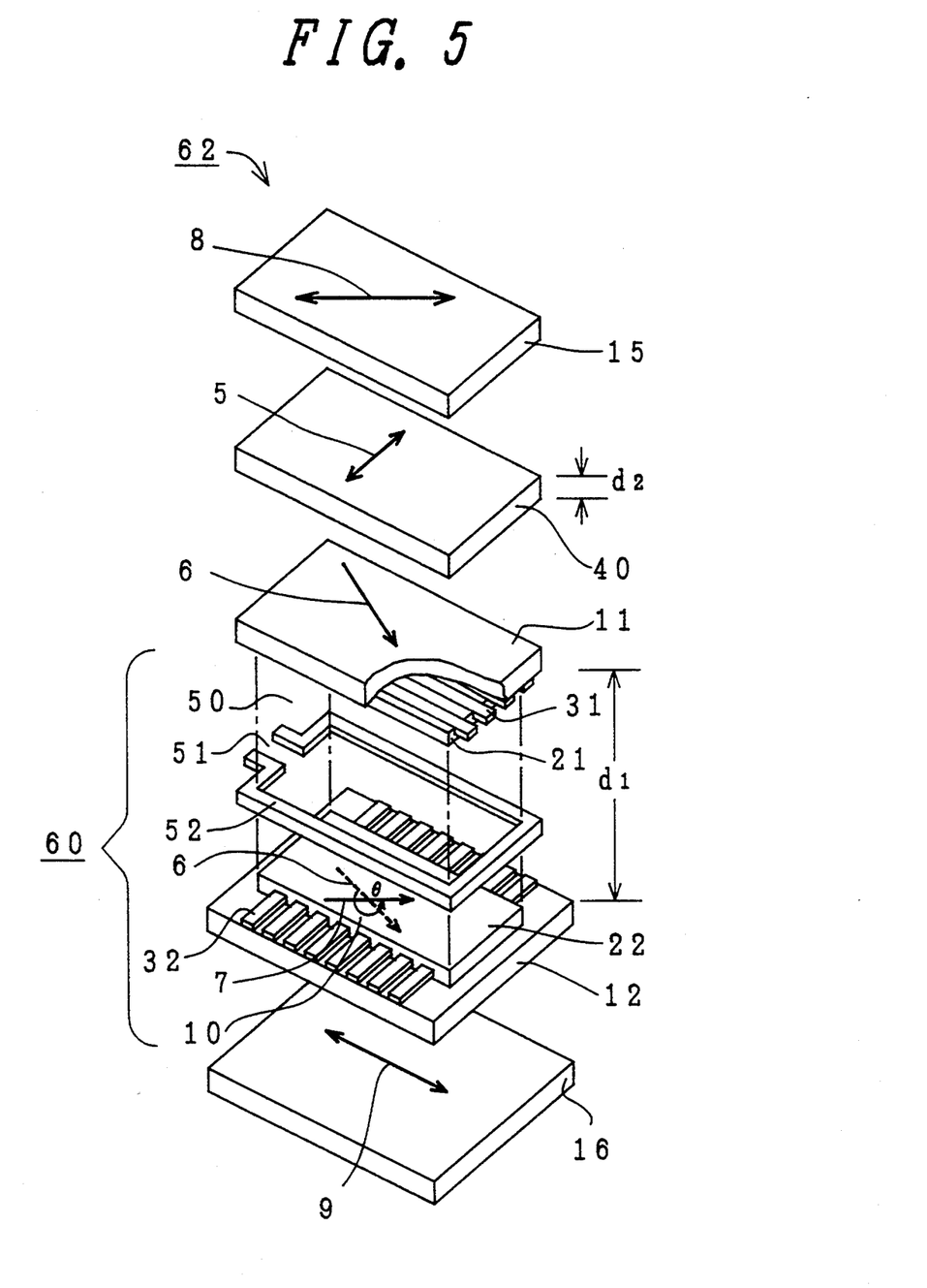
FIG. 5 is an exploded perspective view of the principal part of the liquid crystal display device according to the first embodiment of the present invention.

FIG. 4 is a diagram explanatory of the orientation direction (e.g., rubbing direction) of liquid crystal molecules, the twist direction thereof, the direction of the polarization axis (or absorption axis) of a polarizer, and the optical axis direction of a member bringing about a birefringence effect when viewed from the upper side of a liquid crystal display substrate 62 to which the present invention is applied. FIG. 5 is a perspective view of the liquid crystal display substrate 62 according to the present invention.

The twist direction 10 and the helix angle Θ of liquid crystal molecules are determined by the rubbing direction 6 of an orientation layer 21 on an upper electrode substrate 11, the rubbing direction 7 of an orientation layer 22 on a lower electrode substrate 12, and the kind and amount of a light application substance to be added to a nematic liquid crystal layer 50 held between the upper and lower electrode substrates 11, 12.

In order to orientate liquid crystal molecules in such a way that they have a twisted spiral structure between the upper and lower electrode substrates 11, 12 which hold the liquid crystal layer 50 in FIG. 5, the surfaces of the orientation layers 21, 22 in contact with the upper and lower electrode substrates 11, 12 need rubbing unidirectionally by means of cloth, for example, the orientation layers being made of organic polymeric resin, such as polyimide. The rubbing direction 6 in the case of the upper electrode substrate 11 and the rubbing direction 7 in the case of the lower electrode substrate 12 are equal to the orientation directions of the liquid crystal molecules. Two of the upper and lower electrode substrates 11, 12 that have been subjected to the orientation process are set opposite to each other with a gap d1 therebetween in such a way that their rubbing directions 6, 7 intersect at angles ranging from 180° to 360°. Further, two of the upper and lower electrode substrates 11, 12 are joined together using a frame-like sealing agent 52 having a cut 51 through which liquid crystal is injected. When the nematic crystal having positive dielectric anisotropy and containing a predetermined amount of light application substance is sealed in the gap, the liquid crystal molecules show a molecular arrangement having a spiral structure at a twist angle of Θ between the electrode substrates as shown in FIG. 5. Numerals 31, 32 denote upper and lower electrodes, respectively. A member offering the birefringence effect (hereinafter called "birefringence member") 40 is disposed on the upper electrode substrate 11 of a liquid crystal cell 60 thus arranged. The member 40 and the liquid crystal cell 60 are held between upper and lower polarizers 15, 16.

The twist angle Θ of the liquid crystal molecules in the liquid crystal should preferably range from 200° to 300°. However, that angle should more preferably range from 230° to 270° from the practical point of view to avoid a phenomenon in which a lighting state in the neighborhood of the threshold level of a transmittivity—applied voltage curve corresponds to a light scattering orientation and to maintain fine time sharing characteristics. This condition basically acts to make the response of the liquid crystal molecules sensitive to the voltage and materializes excellent time sharing characteristics. Moreover, the product $\Delta n1 \cdot d1$ of the refractive index anisotropy $\Delta n1$ and the thickness d1 of the liquid crystal layer 50 should preferably range from 0.5 μm to 1.0 μm and more preferably range from 0.6 μm to 0.9 μm to attain a superior display quality.

The birefringence member 40 acts to modulate the polarizing state of light passing through the liquid crystal cell 60 and converts the colored display only made by the single body of the liquid crystal cell 60 to a white-black display. In view of this, the product $\Delta n2 \cdot d2$ of the refractive index anisotropy $\Delta n2$ and the thickness d1 of the birefringence member 40 becomes extremely important and it should preferably range from 0.4 μm to 0.8 μm and more preferably range from 0.5 μm to 0.7 μm.

Since the liquid crystal display substrate 62 makes use of elliptic polarization based on birefringence, further, the relation between the optical axis and the liquid crystal orientation directions 6, 7 of the electrode substrates 11, 12 of the liquid crystal cell 60 is extremely important when the axes of the polarizers 15, 16 and an uniaxial transparent birefringence plate, such as the birefringence member 40' are employed.

Referring to FIG. 4, the action and effect of the aforementioned relation will subsequently be described. FIG. 4 shows the relations among the axes of the polarizers, the optical axis of the uniaxial transparent birefringence member and the liquid crystal orientation directions of the electrode substrates of the liquid crystal cell as viewed from above the liquid crystal display device structured as shown in FIG. 5.

In FIG. 5, numeral 5 denotes the optical axis of the uniaxial transparent birefringence member 40, 6 the liquid crystal orientation direction of the upper electrode substrate 11 adjacent to the birefringence member 40, 7 the liquid crystal orientation direction of the lower electrode substrate 12, 8 the absorption axis or the polarization axis of the upper polarizer 15, and 9 the absorption axis or the polarization axis of the lower polarizer 16. An angle α is formed by the liquid crystal orientation direction 6 of the upper electrode substrate 11 with the optical axis 5 of the uniaxial birefringence member 40. An angle β is formed by the absorption axis or the polarization axis 8 of the upper polarizer 15 with the optical axis 5 of the uniaxial transparent birefringence member 40. An angle τ is formed by the absorption axis or the polarization axis 9 of the lower polarizer 16 with the liquid crystal orientation direction 7 of the lower electrode substrate 12.

Figure 9A:
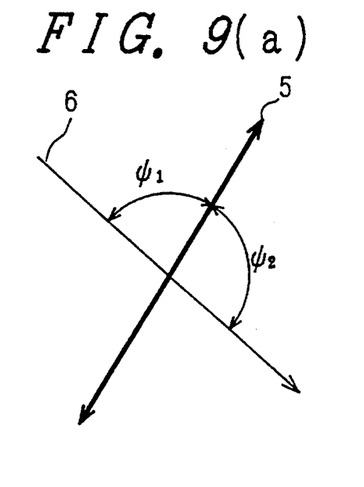
FIGS. 9(a) and 9(b) are diagrams explanatory of a method of measuring angles α, β, τ.
Figure 9B:
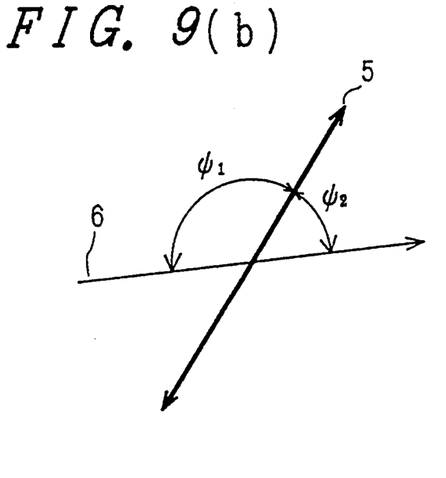

A method of measuring the angles α, β, τ will be defined. Referring to FIGS. 9(a) and 9(b), a description will be given of the crossing angle between the optical axis 5 of the birefringence member 40 and the liquid crystal orientation direction 6 of the upper electrode substrate. Although the crossing angle between the optical axis 5 and the liquid crystal orientation direction can be expressed by $\phi1$, $\phi2$ as shown in FIG. 9(a), smaller one of $\phi1$, $\phi2$ is adopted in this example. More specifically, $\phi1$ is made the crossing angle $\alpha$ between the optical axis 5 and the liquid crystal orientation direction 6 since $\phi1 < \phi2$ in FIG. 9(a), whereas $\phi2$ is made the crossing angle $\alpha$ between the optical axis 5 and the liquid crystal orientation direction 6 since $\phi1 > \phi2$ in FIG. 9(b). When $\phi1 = \phi2$, either one may be adopted.

The angles $\alpha$, $\beta$, $\tau$ are extremely important for the liquid crystal display substrate to which the present invention is applied.

The angle $\alpha$ should preferably range from 50° to 90° and more preferably range from 70° to 90°; the angle $\beta$ should preferably range from 20° to 70° and more preferably range from 30° to 60°; and the angle $\tau$ should preferably range from 0° to 70° and more preferably range from 0° to 50°.

On condition that the twist angle $\Theta$ of the liquid crystal layer of the liquid crystal cell 60 is in the range of 180° to 360°, it may be acceptable for the angles $\alpha$, $\beta$, $\tau$ to remain in the respective ranges defined above even though a twisting direction 10 is either clockwise or counterclockwise.

Although the birefringence member 40 has been arranged between the upper polarizer 15 and the upper electrode substrate 11 in FIG. 5, it may be disposed between the lower electrode substrate 12 and the lower polarizer 16 instead. The whole arrangement in this case is equivalent to what is turned upside-down.

EXAMPLE 1

Figure 6:
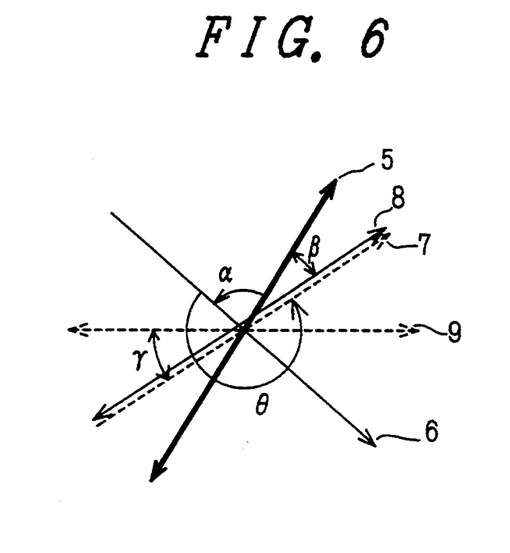
FIG. 6 is a diagram explanatory of directions in which liquid crystal molecules are arranged and twisted, a direction of the axis of a deflecting plate, and the related optical axis of a refracted member in a liquid crystal display device according to a second embodiment of the present invention.

The basic structure is similar to what is shown in FIGS. 4 and 5. As shown in FIG. 6, liquid crystal molecules have a twist angle of 240°. A parallel oriented (homogeneously oriented) liquid crystal cell having a twist angle of 0° is used for the uniaxial transparent birefringence member 40 in this case. The ratio d/p of the thickness d($\mu$m) of a liquid crystal layer to the spiral pitch p($\mu$m) of liquid crystal materials containing the light application substance is set at 0.53. Orientation films 21, 22 for use are prepared from polyimide resin films that have been subjected to the rubbing process. A pretilt angle is set at 3.0° or 4.0° with which the orientation film subjected to the rubbing process is used to orient the liquid crystal molecules in contact therewith in the tilt mode with respect to the surface of the substrate. Further, $\Delta n2 \cdot d2$ of the uniaxial transparent birefringence member 40 is roughly 0.6 $\mu$m. On the other hand, $\Delta n1 \cdot d1$ of the liquid crystal layer 50 having the structure twisted by 240° is roughly 0.8 $\mu$m.

By setting the angle $\alpha$ at about 90°, the angle $\beta$ at about 30° and the angle $\tau$ at about 30°, non-transmission of light, that is, black is displayed when the voltage applied via the upper and lower electrodes 31, 32 to the liquid crystal layer 50 is not higher than the threshold level, whereas transmission of light, that is, white is displayed when that voltage is not lower than the threshold level. The white-black display is thus materialized. When the axis of the lower polarizer 16 is turned from the aforementioned position by 50° to 90°, moreover, an inverted white-black display occurrs; that is, white is displayed when the voltage applied to the liquid crystal layer 50 is not higher than the threshold level, whereas black is displayed when the voltage is not lower than the threshold level.

Figure 7:
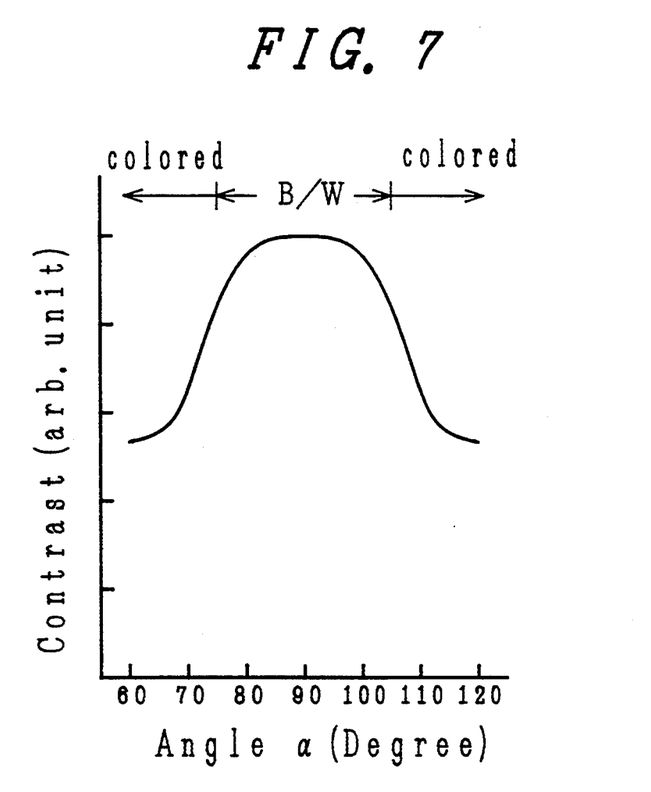
FIG. 7 is a graph showing a contrast and transmission light color—crossing angle α characteristics with respect to the liquid crystal display device according to the first embodiment of the present invention.
Figure 8:
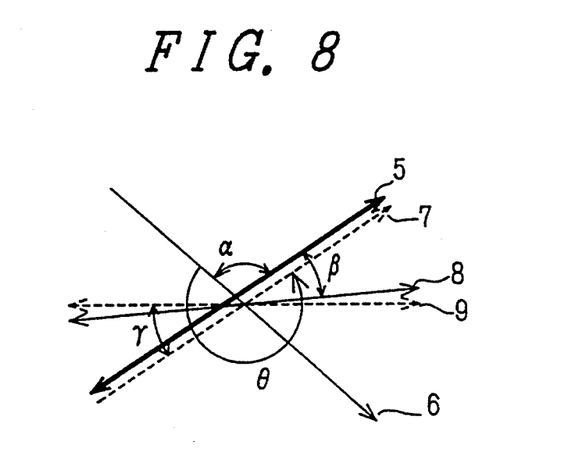
FIG. 8 is a diagram explanatory of directions in which liquid crystal molecules are arranged and twisted, a direction of the axis of a polarizer and the related optical axis of a refracted member in the liquid crystal display device according to a third embodiment of the present invention.

FIG. 7 shows contrast variations at the time the device is driven in time sharing with a 1/200 duty-cycle when the angle $\alpha$ is varied with the arrangement shown in FIG. 6. The contrast is sharp when the angle $\alpha$ is in the neighborhood of 90° and becomes dull as the angle is shifted therefrom. As the angle $\alpha$ decreases, moreover, both lighting and non-lighting portions becomes bluish and as the angle $\alpha$ increases, the non-lighting portion becomes purple, whereas the lighting portion becomes yellow. As a result, the white-black display is impossible. Although, substantially the same result is obtained at the angles $\beta$ and $\tau$, the inverted white-black display occurs when the polarizer is turned from the aforementioned position by 50° to 90°.

EXAMPLE 2

The basic structure is similar to that in Example 1. However, the difference between Examples 1 and 2 lies in the fact that the twist angle of liquid crystal molecules of the liquid crystal layer 50 is 260° and that $\Delta n1 \cdot d1$ roughly ranges from 0.65 $\mu$m to 0.75 $\mu$m. Further, $\Delta n2 \cdot d2$ of the parallel oriented liquid crystal layer used as the birefringence member 40 is set at about 0.58 $\mu$m as in the case of Example 1. The ratio d/p of the thickness d($\mu$m) of the liquid crystal layer to the spiral pitch p($\mu$m) of nematic liquid crystal materials containing the light application substance is set at 0.57.

By setting the angle $\alpha$ at about 100°, the angle $\beta$ at roughly 35° and the angle $\tau$ at roughly 15°, the white-black display is thus materialized as in the case of Example 1. When the axis of the lower polarizer is turned from the aforementioned position by 50° to 90°, moreover, an inverted white-black display is produced.. With respect to the angles $\alpha$, $\beta$, $\tau$, substantially the same propensity is observed.

Although use is made of the parallel oriented liquid crystal cell free from the twisting of liquid crystal molecules as the uniaxial transparent birefringence member 40 in both examples above, variations in color due to variations in angle are made rather reducible by using a liquid crystal layer whose liquid crystal molecules have been twisted by roughly 20° up to 60°. Like the aforementioned liquid crystal layer 50, this twisted liquid crystal layer is formed by holding liquid crystals between substrates so arranged as to make the orientation processing directions of a pair of transparent substrates subjected to the orientation process cross at a predetermined twist angle. In this case, the bisection angular direction at an included angle in two orientation processing directions holding the twisted structure of the liquid crystal molecules may be handled as the optical axis of the birefringence member. Moreover, a transparent polymeric film (an uniaxially extended one is preferred in this case) may be used as the birefringence member 40. In this case, PET (polyethylene, terephthalate) films, acrylic resin films or polycarbonate films may be effective for use as such polymeric films.

Although a single body birefringence member is employed in Examples 1 and 2, another birefringence member in addition to the birefringence member 40 may be inserted between the lower and upper electrode substrates 12, 16. In this case, the $\Delta n2 \cdot d2$ of theses birefringence members needs readjusting.

EXAMPLE 3

Figure 10:
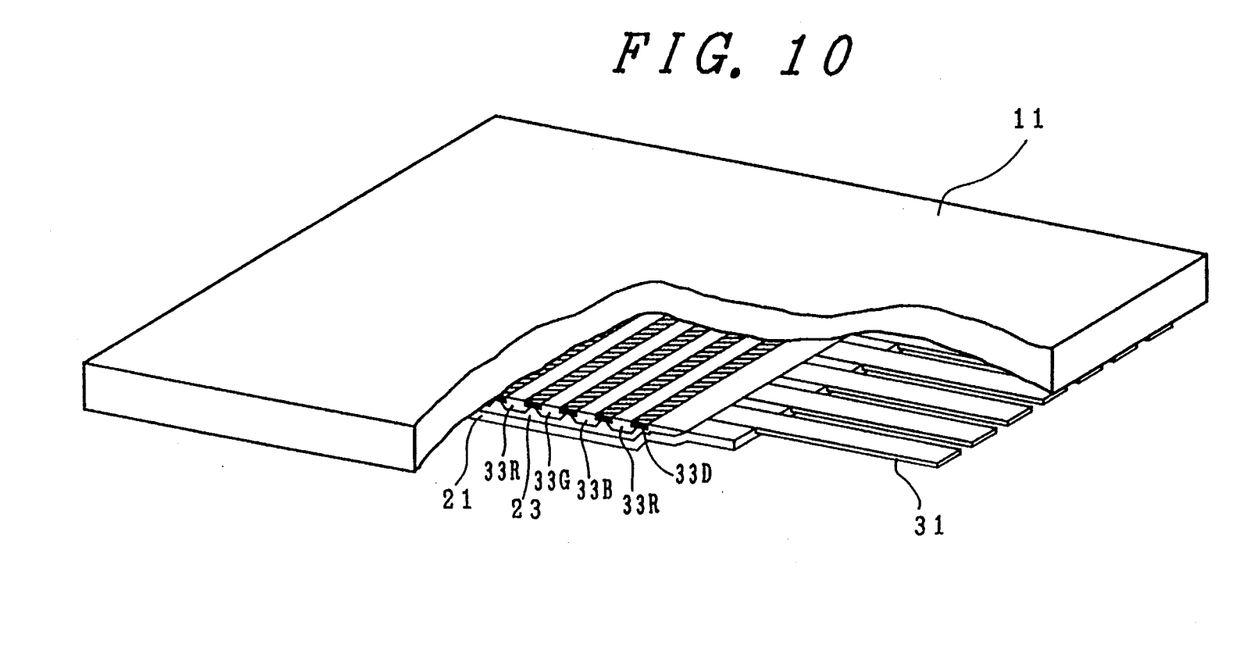
FIG. 10 is a partial cutaway view of an upper electrode substrate of the liquid crystal display device according to the first embodiment of the present invention.

The basic structure is similar to that in Example 1. As shown in FIG. 10, however, a multi-color display is made possible by providing red, Green and blue color filters 33R, 33G, 33B on the upper electrode substrate 11, and a light shielding film 33D between the filters.

As shown in FIG. 10, moreover, the upper electrode 31 and the orientation film 21 are formed on a smoothing layer 23 made of insulating material and formed on the filters 33R, 33G, 33B and the light shielding film 33D, the smoothing layer being intended to compensate for unevenness resulting from the provision of the filters and the shielding film.

EXAMPLE 4

This example includes a compact liquid crystal display module 63 integrally incorporating the liquid crystal display substrate 62 in Example 3, a drive circuit for driving the liquid crystal display substrate 62 and a light source.

Figure 11:
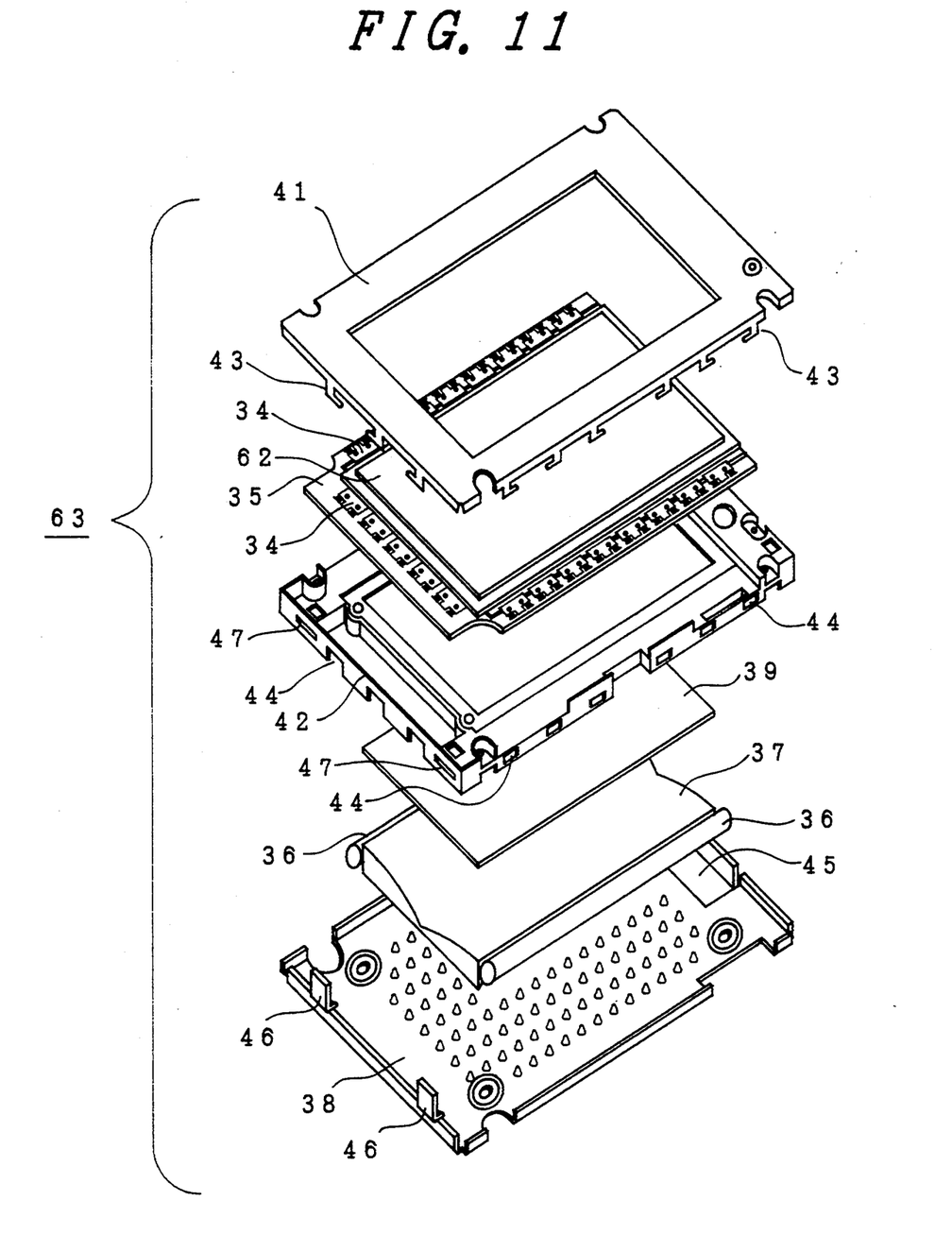
FIG. 11 is an exploded perspective view of a liquid crystal module according to the present invention.

FIG. 11 is an exploded perspective view of the aforesaid combination. An IC 34 for driving the liquid crystal display substrate 62 is mounted on a frame-like printed circuit board 35 having a window for receiving the liquid crystal display substrate 62. The printed circuit board 35 fitted with the liquid crystal display substrate 62 is fitted in the window of a plastic-molded frame body 42. A metal frame 41 is laid over the liquid crystal display substrate 62 and the frame 41 is secured to the frame body 42 by bending its pawl 43 within cuts 44 formed in the frame body 42.

The following component parts are fitted from the rearside of the frame body 42 in the order shown in FIG. 11; namely, cold cathode fluorescent lamps 36 respectively arranged at the upper and lower ends of the liquid crystal display substrate 62, a light-leading material 37 formed with an acrylic plate for uniformly irradiating the liquid crystal cell 50 with light derived from the cold cathode fluorescent lamps 36, a reflector 38 formed by applying white paint to a metal plate, and a milk-white diffusion plate 39 for diffusing light from the light-leading material 37. An invertor power supply circuit (not shown) for powering the cold cathode fluorescent lamp 36 is accommodated in a recess (not shown, though it is positioned at a position opposite to a recess 45 of the reflector 38). The diffusion plate 39, the light-leading material 37, the cold cathode fluorescent lamp 36 and the reflector 38 are secured by bending a tongue 46 fitted thereto within a small space 47 provided in the frame body 42.

Figure 1:
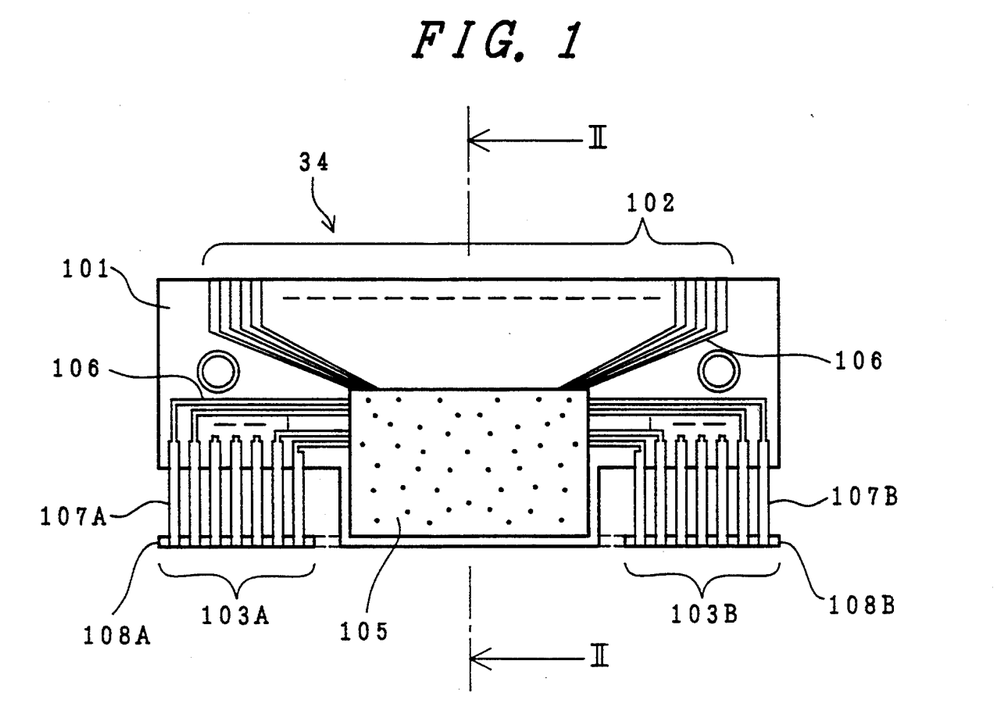
FIG. 1 is a top view of a semiconductor device embodying the present invention.
Figure 2:
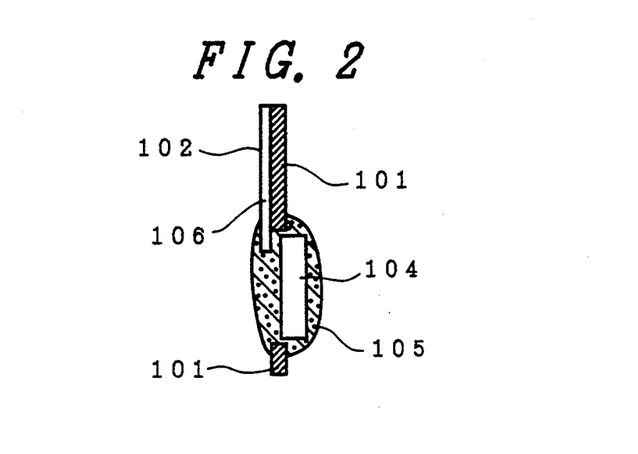
FIG. 2 is a sectional view taken on line II—II of FIG. 1.

Referring to FIGS. 1 and 2, a detailed description will subsequently be given of a semiconductor device called a driving IC 34 as mentioned above. FIG. 1 is a top view of the liquid crystal display device and FIG. 2 is a sectional view taken on line II—II of FIG. 1.

As shown in FIG. 1, there is provided a substantially rectangular flexible film-like substrate 101. In addition, a group of electrodes 102 connected to the group of electrodes formed on the liquid crystal display substrate 62 is formed on one side of the film-like substrate 101 in its longitudinal direction.

On the other hand, groups of electrodes 103A, 103B to be connected to the group of electrodes formed on the printed circuit board 35 are formed on the side opposite to one side of the film-like substrate 101 above. The groups of electrodes 103A, 103B are respectively located on both sides of a resin mold 105 used to cover a semiconductor chip (as referred to with 104 in FIG. 2). The semiconductor chip 104 covered with the resin mold 105 is installed close to the other side of the film-like substrate 101.

The leading ends of the electrodes 102, 103A, 103B are aligned on one side of the film-like substrate 101 and the plurality of electrodes are extend in the direction perpendicular to that one side.

The electrodes constituting each of the groups of electrodes 102, 103A, 103B are connected via a wiring layer 106 formed on the surface of the film-like substrate 101 to the semiconductor chip 104 in the resin mold 105.

The film-like substrate 101 beneath the groups of electrodes 103A, 103B is provided with notches 107A, 107B extending in parallel with the respective electrodes, whereby the leading and trailing ends of each electrode serve to link the electrode and the film-like substrate.

Film-like substrate pieces 108A, 108B for supporting the respective leading ends of the electrodes formed via the notches 107A, 107B are separated from the film-like substrate 101 in the neighborhood of the resin mold 105 (as shown by a dotted line). (In the prior art, these pieces are not separated from the film-like substrate).

FIG. 2 is a sectional view taken on line II—II and illustrative of the semiconductor chip 104 contained in the resin mold 105.

Figure 3:
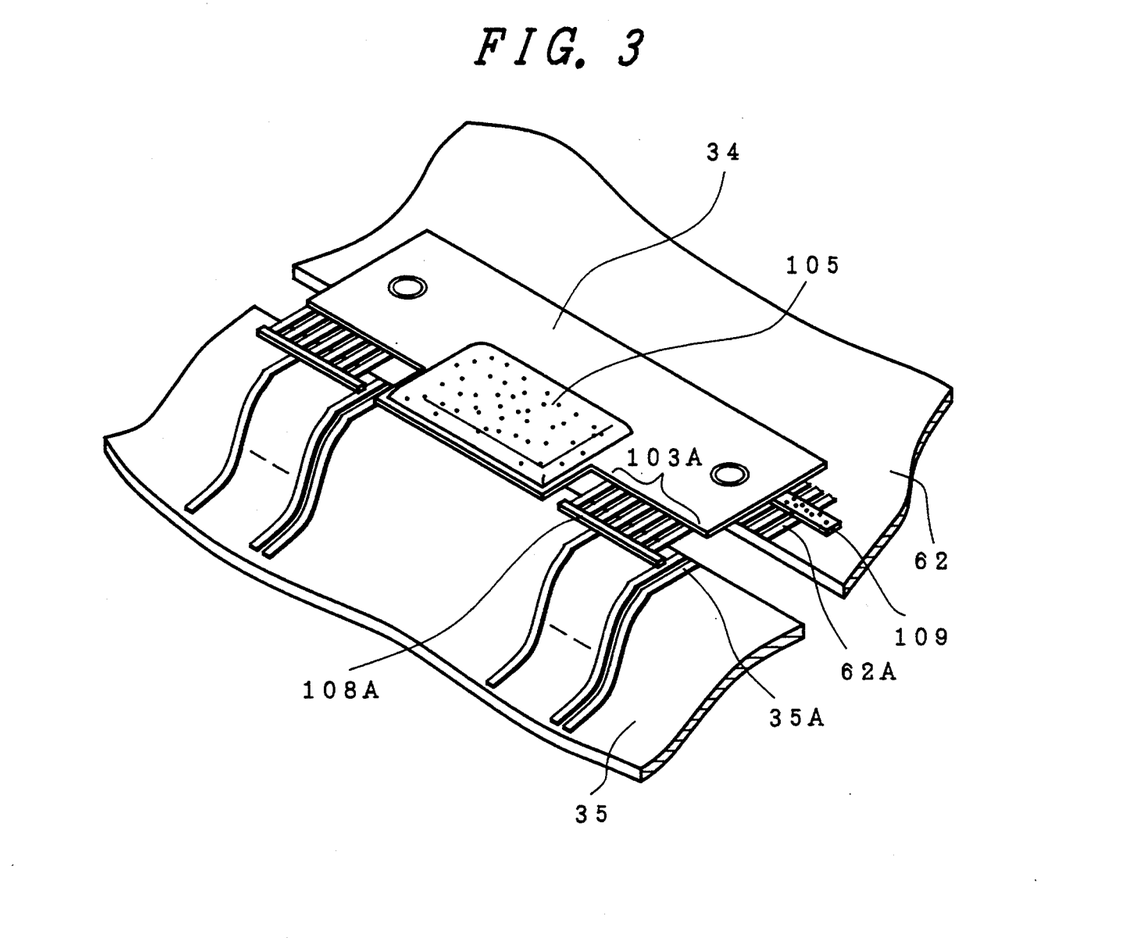
FIG. 3 is a perspective view of the principal part including the semiconductor device, a liquid crystal display device and a circuit board for use in the present invention.

FIG. 3 is a diagram illustrating the driving IC 34 connected to the printed circuit board 35 and the liquid crystal display substrate 62. In FIG. 3, the driving IC 34 is upside down with reference to FIG. 1 and the electrodes 103A, 103B in groups are shown opposite to the respective electrodes 35A of the printed circuit board 35, whereas the electrodes 102 are shown opposite to the respective electrodes 62A of the liquid crystal display substrate 62.

Each of the electrodes in the groups 103A, 103B and each of those in the group 35A of the printed circuit board 35 are coupled by soldering, whereas each of the electrodes in the group 102 and each of those in the group 62A of the liquid crystal display substrate 62 are coupled via a so-called anisotropic conductive film 109.

With respect to the driving IC 34 thus arranged, the film-like substrate pieces 108A, 108B supporting the leading ends of the electrodes constituting the respective groups of electrodes 103A, 103B are not connected to the film-like substrate 101 in the neighborhood of the resin mold 105 but are separated therefrom.

Even though an external force is applied to the film-like substrate pieces 108A, 108B, the transmission of the force is blocked by the separated portion and consequently the force is prevented from being transmitted to the resin mold 105.

Therefore, the external force applied to the film-like substrate pieces 108A, 108B is not concentrated on the periphery of the resin mold 105. Thus no crack is developed in the resin mold 105.

EXAMPLE 5

The liquid crystal display module 63 in Example 4 is used in the display unit of a laptop personal computer.

Figure 12:
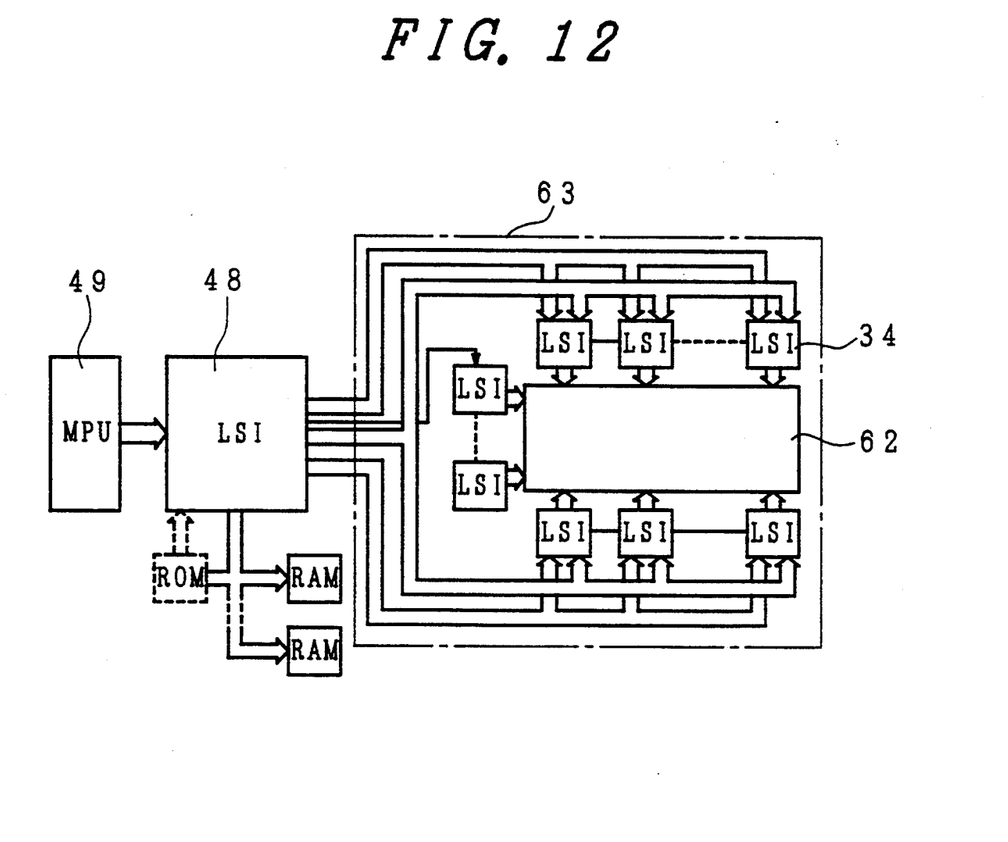
FIG. 12 is a block diagram of a laptop personal computer embodying the present invention.
Figure 13:
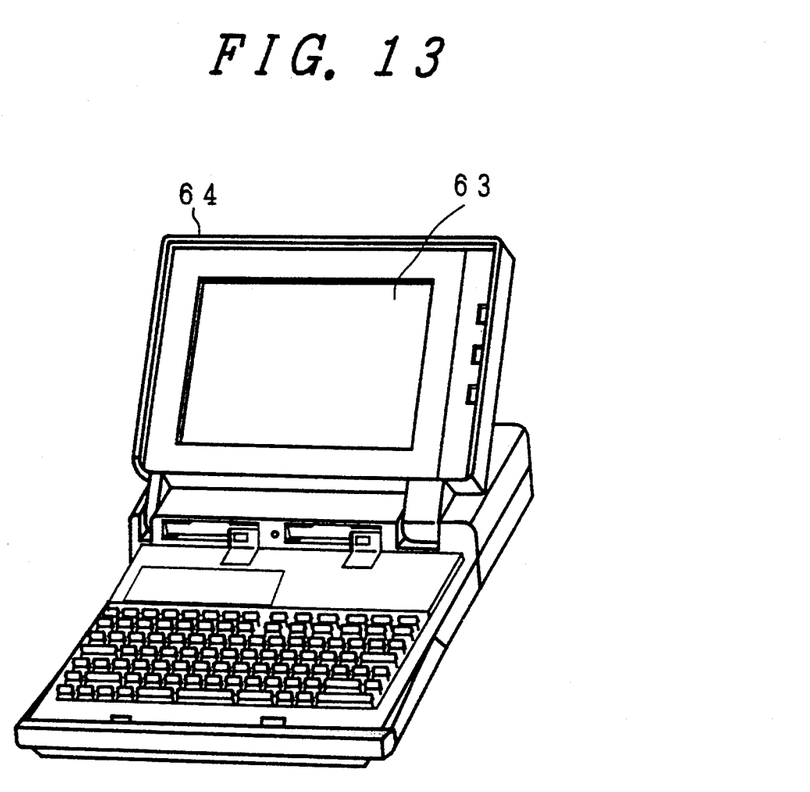
FIG. 13 is a perspective view of the laptop personal computer according to the present invention.

FIG. 12 is a block diagram illustrating a system configuration of a laptop personal computer and FIG. 13 is a perspective view of such a personal computer having the liquid crystal display that has been packaged therein. In the personal computer, the results computed by a microprocessor 49 are used to drive the liquid crystal display module by means of the driving IC 34 via a control LSI 48.

Although the semiconductor device according to the present invention has been applied to the driving IC for use in a liquid crystal display device by way of example, its application is, needless to say, not limited to such a liquid crystal display device.

As set forth above, the resin mold in the semiconductor device according to the present invention is set free from developing a crack.

It is further understood by those in the art that the foregoing description is directed to a preferred embodiment of the present invention and that various changes and modifications may be made in the described embodiment without departing from the spirit and scope of the present invention.

Although a description has been given of the liquid crystal display device using a STN (Super Twisted Nematic) cell according to the embodiment shown, a TFT (Thin Film Transistor) or a MIM (Metal Insulator Metal) may be used as a switching element in a liquid crystal display device using TN (Twisted Nematic) crystals, ferroelectric or polymer dispersed liquid crystals.

What is claimed is:

1. A liquid crystal display device comprising:
   a liquid crystal display substrate;
   a semiconductor device electrically connected to the liquid crystal display substrate; and
   a circuit board electrically connected to the semiconductor device;
   said semiconductor device comprising:
   (a) a film-like substrate;
   (b) a semiconductor chip provided on the film-like substrate;
   (c) a plurality of first electrodes provided on the film-like substrate and electrically connected to the liquid crystal display substrate;
   (d) a plurality of second electrodes provided on the film-like substrate and electrically connected to the circuit board;
   the film-like substrate being substantially rectangular, the first electrodes being provided on one long side of the film-like substrate, the film-like substrate having a projecting portion on the other long side of the film-like substrate, at least one part of the semiconductor chip being provided in the projecting portion, the second electrodes protruding from the film-like substrate on both sides of the projecting portion, ends of the second electrodes being provided with film-like substrate pieces for fixing the plurality of second electrodes, the film-like substrate and the film-like substrate pieces being separated so as to be independently movable.

2. A liquid crystal display device as claimed in claim 1, wherein the second electrodes substantially extend up to an extended line of the projecting portion.

3. A liquid crystal display device as claimed in claim 1, wherein the semiconductor chip is covered with a resin mold.

4. A liquid crystal display device as claimed in claim 1, wherein the plurality of first electrodes and electrodes provided on the liquid crystal display substrate are electrically connected by an anisotropic conductive film.

5. A liquid crystal display device as claimed in claim 1, wherein the circuit board and the plurality of second electrodes are electrically connected by soldering.

6. A liquid crystal display device as claimed in claim 1, wherein the plurality of first electrodes and electrodes provided on the liquid crystal display device are electrically connected by an anisotropic conductive film, and wherein the circuit board and the plurality of second electrodes are electrically connected by soldering.

7. A semiconductor device comprising:
   (a) a film-like substrate;
   (b) a semiconductor chip provided on the film-like substrate;
   (c) a plurality of first electrodes provided on the film-like substrate and electrically connected to a display substrate;
   (d) a plurality of second electrodes provided on the film-like substrate and electrically connected to a circuit board;
   the film-like substrate being substantially rectangular, the first electrodes being provided on one long side of the film-like substrate, the film-like substrate having a projecting portion on the other long side of the film-like substrate, at least one part of the semiconductor chip being provided in the projecting portion, the second electrodes protruding from the film-like substrate on both sides of the projecting portion, ends of the second electrodes being provided with film-like substrate pieces for fixing the plurality of second electrodes, the film-like substrate and the film-like substrate pieces being separated so as to be independently movable.

8. A semiconductor device as claimed in claim 7, wherein the second electrodes substantially extend up to an extended line of the projecting portion.

9. A semiconductor device as claimed in claim 7, wherein the semiconductor chip is covered with a resin mold.

* * * * *